United States Patent

Dostoomian et al.

Patent Number: 4,657,169
Date of Patent: Apr. 14, 1987

[54] NON-CONTACT DETECTION OF LIQUEFACTION IN MELTABLE MATERIALS

[75] Inventors: Ashod S. Dostoomian, Stoughton; Riccardo Vanzetti, Brockton, both of Mass.

[73] Assignee: Vanzetti Systems, Inc., Mass.

[21] Appl. No.: 619,438

[22] Filed: Jun. 11, 1984

[51] Int. Cl.⁴ ............................................. B23K 31/00
[52] U.S. Cl. ....................................... 228/103; 228/9; 228/180.2
[58] Field of Search ................. 228/103, 9, 105, 180.2

[56] References Cited

U.S. PATENT DOCUMENTS

| | | | |
|---|---|---|---|
| 3,409,198 | 11/1968 | Peterman | 228/9 |
| 4,224,744 | 9/1980 | Siegel et al. | 228/103 |
| 4,327,265 | 4/1982 | Edinger et al. | 228/103 |
| 4,354,629 | 10/1982 | Grassauer | 228/180.2 |

Primary Examiner—Nicholas P. Godici
Assistant Examiner—Karen Skillman
Attorney, Agent, or Firm—Sughrue, Mion, Zinn, Macpeak & Seas

[57] ABSTRACT

The melting of solder in a reflow soldering operation is detected by examining the rate of change of the solder temperature or by detecting a change in a surface reflectance characteristic of the solder which occurs upon melting.

24 Claims, 14 Drawing Figures

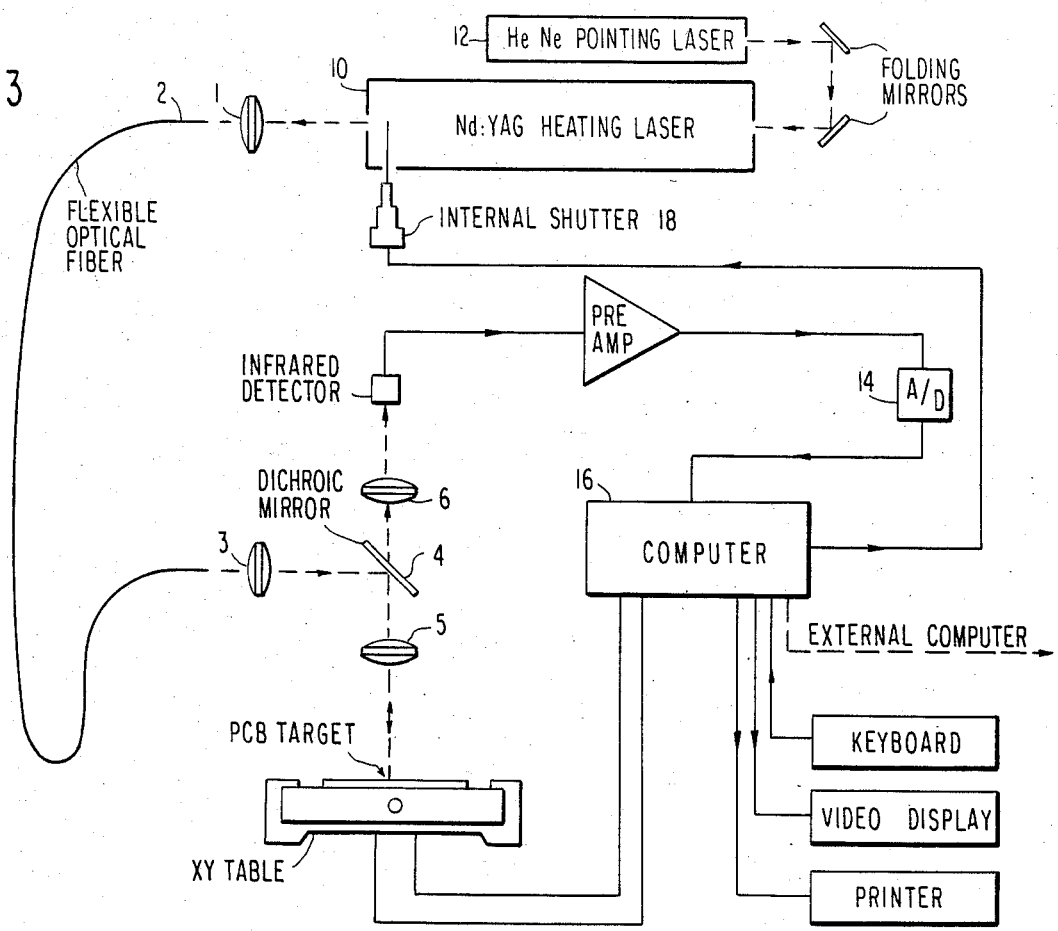
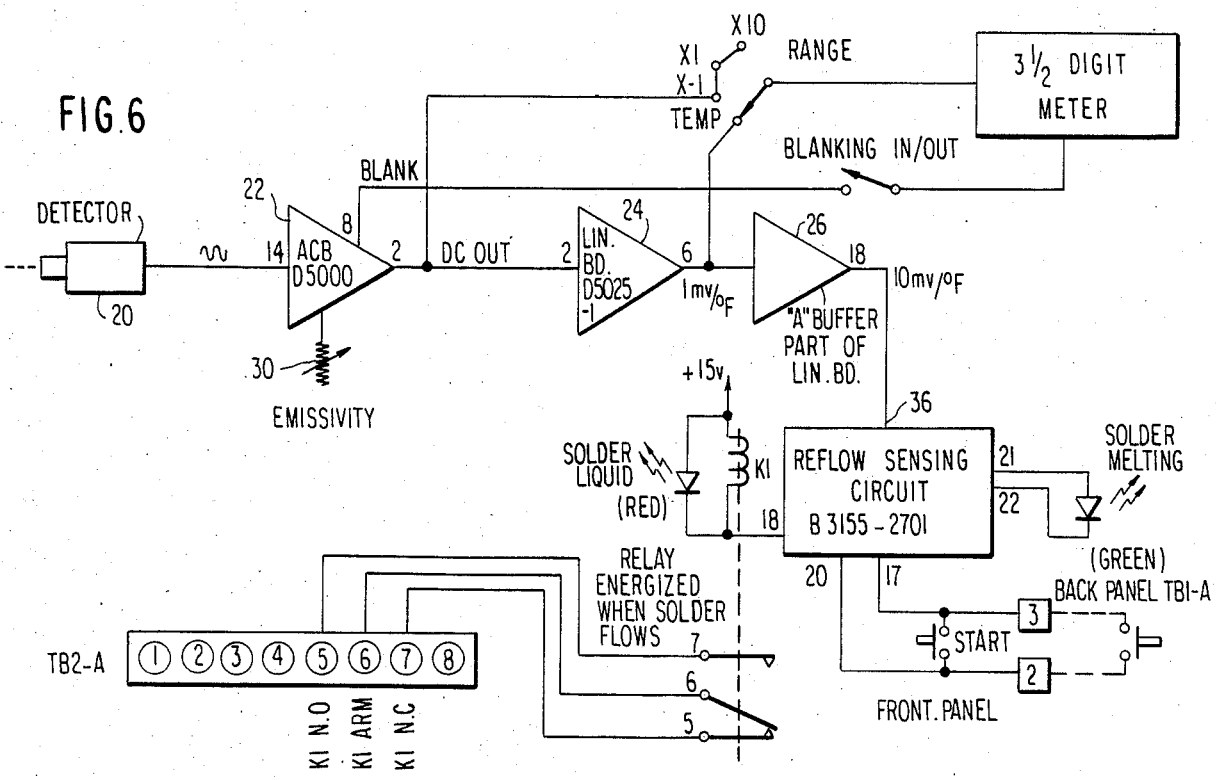

NON-CONTACT DETECTION OF LIQUEFACTION IN MELTABLE MATERIALS

BACKGROUND OF THE INVENTION

This invention is directed to a method of determining the exact moment when a material is undergoing a change of state, e.g., in industrial or scientific processes. The invention is more particularly directed to the detection of the exact moment of melting in solids which are being heated to their melting points. It applies also to the detection of "freezing" in liquids which are being cooled to their solidification points.

The invention is especially applicable to the electronics manufacturing industry, particularly in the manufacture of printed circuit boards and the like where molten solder is applied at an electrical connection in order to form a permanent mechanical and electrical bond between two conductors. However, it should be appreciated that there are a wide variety of uses for the invention and it will be described in the context of printed circuit board manufacturing by way of example only.

The process of applying solder to form a permanent mechanical and electrical bond between two conductors on a printed circuit board is carried out in various ways which will be familiar to practitioners of the soldering art and will not be discussed at length here. For small-scale production, solder joints are individually hand-soldered; for large-scale production, an entire circuit board containing hundreds or thousands of solder-joints-to-be can be soldered in one step by wave-soldering or by reflow soldering. In the former, after certain preparatory steps, the board is passed over the surface of a molten solder bath where the solder is caused to adhere to local areas at the intended joints. In reflow soldering, individual solder pads are formed at the desired locations by use of molten solder which is then allowed to solidify. The desired electrical conductors are then placed in mechanical contact with their proper pads and the entire board is raised to the desired temperature either by radiant heating or by various other methods. Careful control is required of heating rates and temperatures.

The preferred embodiment of our invention is addressed to the process of reflow soldering. A particular problem in this process is that all solder joints on a given board do not always have the same amount of solder or of adjoining metal in contact with the solder. The result is that various solder joints will have different heat-input requirements, whereas standard radiant or convective heat-input methods will tend to overheat the smaller joints while underheating the larger ones. This problem is partly overcome by yet another method of reflow soldering, notably vapor phase soldering, but this method is not yet in wide use and it carries other problems which remain to be solved.

In industrial processes such as reflow soldering in which materials are being heat-processed, it is important to know the exact moment when a given solid turns to liquid or vice-versa. It is also advantageous to be able to make this determinaion without making physical contact with the sample and without having to know the radiant emissivity of the surface.

SUMMARY OF THE INVENTION

It is therefore an object of the present invention to provide a method and apparatus for non-contact detection of liquefaction in metals, and more particularly a method and apparatus for detecting the reflow of solder in a solid solder joint undergoing melting.

It is a further object of this invention to provide such a method and apparatus wherein the beginning and end points of reflow can be accurately detected.

In a first embodiment of the present invention, the surface of a material being heated to its melting point is monitored by an infrared detection system whose output signal is related to surface temperature. A signal processor recognizes the slight decrease in heating rate which is known to occur as the solid turns to liquid due to the latent-heat-of-fusion phenomenon. The moment at which the transition occurs is automatically signalled by the processor, and the re-solidification of the material can also be recognized by the use of the inverse of the heat-of-fusion effect. In a specific application of the invention to reflow soldering of lap joints, an integral, self-dividing solder preform can be used. The preform comprises an appropriately-shaped strip of solder placed between a row or group of leads and their respective pads, with reflow soldering then being carried out by means of laser beam irradiation. As the preform becomes molten, it will separate itself into individual solder masses, one at each solder joint, through a combination of surface tensile forces and repulsion by the substrate surface. This characteristic can be enhanced by selective application of solder flux to the areas to be soldered or by application of a solder-repellent material to areas of the substrate between solder joints.

In a further embodiment of the invention, solder reflow can be detected by monitoring surface reflectivity characteristics.

BRIEF DESCRIPTION OF THE DRAWINGS

The invention will be more clearly understood with reference to the following description in conjunction with the accompanying drawings, wherein:

FIG. 3 is a brief overall diagram of a reflow solder control system according to a first embodiment of the present invention;

FIG. 6 is a brief schematic diagram of essential components of an analog version of a reflow sensing thermal monitor system according to the present invention;

DETAILED DESCRIPTION OF THE INVENTION

The invention makes use of a well known physical phenomenon dealing with solids which are being heated to their melting points. During heating, the temperature of the solid continues to rise until melting begins. At this point, the further addition of heat causes no further temperature increase until the material is fully melted, after which the liquid will be observed to increase in temperature.

To facilitate a full understanding of the invention, the physical principles by which the solid/liquid change of state can be recognized will first be discussed.

The words "melting" or "fusion" are used to describe the process in which matter is transformed from the solid to the liquid phase. For most materials, particularly crystalline ones such as ice, many metals, and so forth, the transition occurs abruptly at a well defined temperature. This temperature is a constant for each material, provided that the pressure is not changed. By contrast, most amorphous materials such as glass, various waxes and non-crystalline metals pass through a gradual change of state over a broader temperature range. Our invention deals primarily with those materials which melt abruptly.

It is a matter of common experience that the addition of heat to a material will raise its temperature. It is not often realized that, for a material in a given state, the rate of temperature increase is almost exactly proportional to the rate of heat input, whether material is a solid, a liquid, or a gas.

As a heated solid reaches its melting temperature, the further addition of heat energy serves to overcome the molecular binding forces which hold the material rigid. Heat therefore seems to disappear within the material, for a time, without causing a further temperature increase. A well-defined amount of thermal energy is required in order to melt each gram of a given material. This is called the "latent" heat of fusion and it is added to the molecular energy of the material as it becomes liquid. This energy is then restored to the environment during the reverse of the process.

A similar phenomenon occurs when a liquid or a solid turns to gas or "vapor". Heat energy is again used in separating molecules so that no external temperature increase is seen during vaporization. For a given material, the amount of heat needed per gram is again fixed. It is called the "latent heat of vaporization" and is not necessarily related to the latent heat of fusion for the same material. For example, in the case of pure water, the latent heat of fusion is 80 calories per gram and the latent heat of vaporization is 539 calories per gram, both measured at atmospheric pressure.

Once a material has undergone a full transition from one phase to another, the further addition or extraction of heat will result in the expected temperature change.

Figure 1:
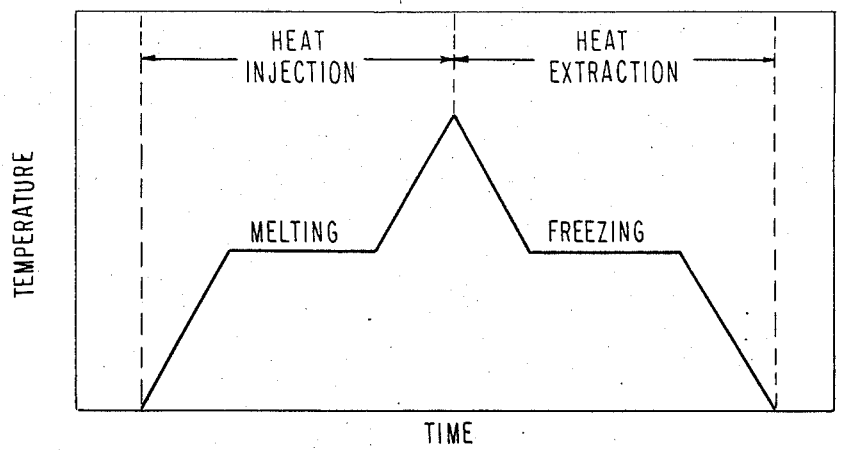
FIG. 1 is an explanatory graph of the temperature v. time characteristics of a material undergoing phase changes with constant heat input and outputs rates assumed and temperature uniformity maintained throughout the material during heating and cooling.

FIG. 1 illustrates an idealized surface-temperature history of a solid which is melted with a constant rate of heat input and is then frozen with a constant heat withdrawal rate. The sloping lines show a constant rate of surface temperature change; the level lines show heat entering or leaving the substance without causing a temperature change. The upper two sloping lines represent the heating and cooling of the material in the liquid state. These may or may not have the same slope as the lower sloping lines, depending upon whether the specific heat of the material changes during the transition.

FIG. 1 assumes that the thermal changes which occur with time do so instantly throughout the material; that is, there are no thermal gradients and all parts are at the same temperature at any one time. Melting and freezing thus occur uniformly throughout the sample.

Figure 2:
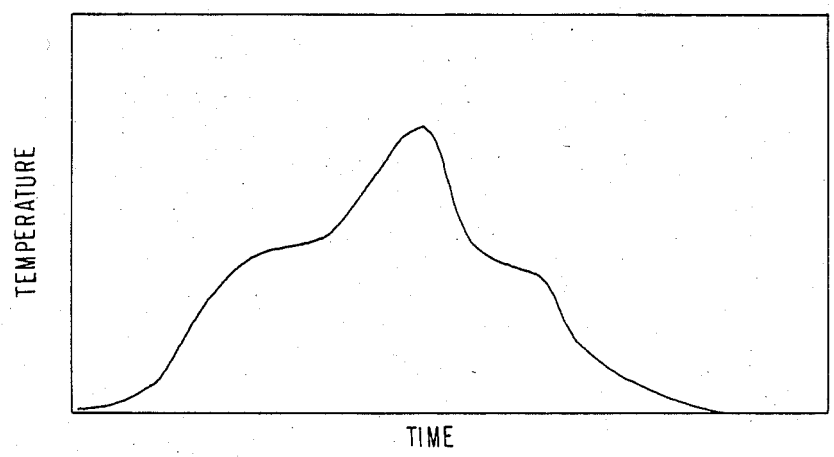
FIG. 2 is an explanatory diagram of the temperature v. time characteristics of a material with normal (non-constant) heating and cooling rates assumed, and with typical internal thermal gradients.

In the practical case, materials to be melted are heated non-uniformly, usually from a surface, and time is required for heat to penetrate the whole volume. Thermal gradients exist, and various parts of the material are at different temperatures at any one time. The part nearest the heat source is the first to melt. Beneath the molten part is a "phase front" or transition boundary, between the liquid and solid states, which progresses through the material as the heat penetrates more deeply. The abrupt heating-rate discontinuities of FIG. 1 are softened by the fact that the change of state occurs at different times in various parts of the material. This can occur at the surface as well, so that the detector is viewing both phases at once. The result is seen in FIG. 2, and this typifies an actual laboratory result where a solid material is heated at one surface and is then allowed to cool normally while the surface temperature is observed.

Another typical principle upon which the invention relies is the infrared measurement of surface temperatures for various materials. This is a science which is more than a century old and which is amply described in the technical literature. It will be discussed only briefly here by saying that all surfaces of temperature greater than absolute zero emit electromagnetic radiation in accordance with their surface temperature. For surfaces below incandescent temperatures, the radiation is primarily infrared and falls into certain wavelength regions according to known physical laws. This makes it possible for one to measure the amount of emitted radiation and to relate it to the surface temperature. The basic method is applicable to incandescent objects as well, the difference being that the emitted radiation will include visible light as well as infrared. This method of temperature measurement and its various forms are referred to by various names such as radiation thermometry, optical pyrometry, infrared radiometry, and so forth. The advantages offered are non-contact sensing (which can be from a convenient distance), high response speed and minimal disturbance of the temperature and process being measured.

An important consideration in radiation thermometry is that all surfaces at a given temperature do not emit the same intensity of radiation. Certain surfaces, such as black ones, and certain surface configurations, such as cavities or flat but roughened surfaces, are better emitters than most light-colored or shiny flat surfaces. This property is described in terms of a quantity called "emissivity", which is measured on a scale from zero to one (or 0 to 100%). The lower value would be for an ideal non-emitter and the upper one is for a perfect emitter, neither of which cases actually occurs in nature although they can be approached quite closely.

Emissivity is important because is must be taken into account when one attempts to relate the measured surface radiation to the actual surface temperature. Quite often, the emissivity of a target surface is unknown or is not known to the accuracy desired, which leaves varying amounts of uncertainty in the resulting temperature values. This point is mentioned here as a prelude to our later discussion in which we indicate that the use of our invention does not require a knowledge of target emissivity, which is an important advantage. Indeed, if the actual melting point of the target material is already known from separate measurements, then the emissivity can be determined via our method.

Another physical principle, which is used in a preferred embodiment of our method, concerns the use of radiant energy to heat a target surface while, at the same time, monitoring the surface temperature by measuring its infrared radiation. The heating-while-measuring process poses the problem that, unless preventive measures are taken, radiation from the heat source can be reflected by the target surface directly into the radiation detector where it can be mistaken for thermal radiation from the target, leading to measurement errors.

As a general case, various workers solve this problem by ensuring that the heating radiation is in a different wavelength band from that to which the detector is sensitive. This is most conveniently done by optical filtering, which is a technique well known to physicists and others; the method is especially simplified if a single-wave-band laser is used as the heating source, for its wavelength content can be removed from the detector spectrum by a fairly simple filter.

Other solutions to the heating-while-measuring problem involve the use of shields or baffles to obstruct heat-source radiation from the detector path, or to heat one part of the target while observing another part. Another possible method is to time-share the processes such as by obscuring the heat source momentarily while making a temperature measurement. When this is to be done on a rapid and repetitive basis, it can be done by use of various or rotating choppers, which are known in the optical art.

A preferred embodiment of the invention comprises at least the following components:

1. A mechanical positioning means for placing a joint which is to be reflow soldered on the axis of an optical system. This may be a manually controlled positioner or it may be a computer-controlled automatic positioning table for the rapid sequential soldering of a large number of joints on a given circuit board. In either case, the stepping resolution and positioning accuracy should be compatible with the physical dimensions of the joint to be soldered; typically, their values should be a fraction of these dimensions;

2. Means for bringing radiant power, typically via a focused laser beam, to the surface of the joint to be soldered, and to do so for a controlled exposure duration or, alternatively, for a programmed series of pulses of equal or variable pulse durations and pulse separations. Use of a single exposure contemplates the possibility that the radiant power intensity itself may be automatically varied throughout the exposure;

3. An optical detection system, typically sensitive to infrared radiation, configured so as to receive a portion of the thermal energy which is radiated by the heated target, and providing an electrical output signal which is related, in a known way, to the amount of emitted target radiation. A requirement on the optical system is that it must in some way be made insensitive to the heating radiation from the laser or other source. This is done preferably by use of optical filtering, although chopping or other obvious means could be employed; and 4. A signal processing system which, by either analog or digital means, can recognize discontinuities in heating rates associated with melting or with freezing.

These items will be discussed in turn as they relate to our preferred embodiment of the invention. With the exception of our signal processing means, the individual methods per se comprise "state-of-the-art" technology and are known to practitioners in the respective fields.

The first above-named element of the present invention, i.e., the mechanical positioning means, may comprise an automatic "XY" positioning table. Such tables, with computer controllers, are used widely throughout industry with far-ranging applications. Their function is to impart a prescribed motion to an item which is being processed in some manner or other. An example would be a machining operation in which a block of metal is sequentially brought to various positions under one or several cutting tools where it is milled, drilled, tapped, etc., to form a complicated shape such as an automotive engine block. Positioning tables range in size from a few square inches. such as are used in the automatic assembly of microscopic electronic parts, to many square feet as used in the garment industry for cutting stacks of cloth into intricate shapes to be made into wearing apparel. For precision applications, tables can be made which move in steps of 0.001" or less and have a positioning repeatability of one-tenth that amount.

Typical table parameters which are envisaged for use with our invention would be:

Table travel: From a few inches in the X and Y directions, for a small circuit board, to several feet in each direction for a multiplicity of larger boards;

Stepping resolution and repeatability: From 0.001" to 0.005" for the former, for most applications, with a repeatability from one-tenth to one-half that of the stepping resolution;

Table speed: For adjacent targets which are spaced, typically, 0.050" to 0.100" apart, the table acceleration, speed and deceleration should be sufficient to allow from five to ten targets per second to be momentarily positioned, at rest, under a designated optical axis, assuming that no time is taken for target processing. In the actual case of reflow soldering, the table will halt for a finite time during the heating step.

With regard to the second above-named element of the invention, i.e., the radiant power source, another art which has become highly developed in the past decade is that of using focused laser beams to provide intense local heating of various targets. Such beams can be used for either for the removal of metal or ceramic, for example, from a part which is to be drilled, scribed, cut, and so forth, or merely to provide a temperature increase such as for melting, heat-treating, welding, and so forth. Many types of lasers are commercially available for these applications. They differ among themselves in beam-power level (from a few watts to several thousand), wavelength band (with single or multiple wavelengths covering the spectrum from ultraviolet through infrared), and in whether they are designed to provide a steady beam (CW) or a pulsed one. Other parameters of interest to laser engineers include spatial mode structure (single vs. multiple), beam divergence, power output stability, beam diameter, longitudinal mode spacing, amplitude noise and ripple, tube lifetime, and many others.

Among the lasers widely used for heat-processing are the Nd:YAG (neodymium-doped yttrium-aluminum-garnet) laser operating in the near-infrared at 1.06 micrometers ($\mu$m) and the carbon dioxide ($CO_2$) laser operating at the greater infrared wavelength of 10.6 $\mu$m. Various considerations such as cost, lifetime, required power, etc., enter into the user's choice between these lasers. One consideration is that, for metal-working use, most metals are somewhat better optical absorbers at the shorter than the longer wavelength, which makes the "YAG" laser somewhat more efficient as a heating source.

Our invention envisages the use of a Nd:YAG laser with a beam power in the range of thirty to fifty watts, with a multi-mode spatial structure, operated CW (continuous wave) and with an optical system that can deliver between one and ten watts of beam power onto a typical solder-joint location.

As a further feature of the invention, we include a length of optical fiber in the path between the laser and the focusing optics in order to homogenize the intensity over the cross section of the laser beam and thus to remove the uneven power density distribution which is inherent in most laser beams. It is desirable for the fiber path to be curved, with a cumulative bend of 90 degrees or more, to ensure efficient scrambling of the laser-beam rays as they proceed throughout its length by means of multiple internal reflections.

The fiber is made typically from glass or a related material having high transparency at the laser wavelength. A reasonable fiber diameter would be about 0.025". This is large enough so that the beam which emerges from the laser is conveniently focused onto one end face by conventional optical methods, and it is thin enough to provide mechanical flexibility. This allows the laser to be placed in an out-of-the-way location and also provides vibration isolation between the laser and XY table whose "start/stop" motion can be a vibration source.

The output end of the fiber serves as a secondary source which is imaged, via conventional optics, onto the target to be heated. Also by conventional optical means, the secondary source may be apertured so as to provide a square, rectangular or other shape more suited to the shapes of non-disclike targets, such as the elongated lap joints which are used with flat-pack integrated circuits. Alternatively, beam-spot elongation in the target plans can be achieved by the addition of a cylindrical lens element in conjunction with the focusing lens. Methods of doing so will be familiar to lens-system designers. Electromechanical means of rotating the cylindrical element through 90 degrees or other angles in order to accommodate randomly oriented lap joints will be familiar to mechanical designers.

Regarding the choice of the optical radiation detection system to be used as the third above-named element of the invention, a variety of methods are available in the art, varying in temperature range, temperature resolution, response speed, cost and so forth. A preferred form uses a lead sulfide detector with conventional glass optics, a radiation chopper, and suitable electronics, as known in the art. Another preferred form, at higher cost but having finer temperature resolution and being useful with targets at lower temperatures, uses infrared optics with a cryogenically cooled detector of indium antimonide. This may be used without a chopper, and the infrared optics comprises one or more lenses of infrared transmitting materials such as sapphire, arsenic trisulfide, zinc selenide or many others which are known. Alternatively, reflecting optics may be used, as is often done in these cases. When no chopper is used, a separate blackbody radiation source can be used to provide a reference temperature.

In the cases of the lead sulfide and indium antimonide detectors, response speeds in the range from microseconds to a few milliseconds are easily achieved by suitable circuitry design. This is more than adequate to follow the warmup of a typical solder joint which is being reflowed because this process requires a great many milliseconds to occur. Such response speeds are equally attainable with other detectors as well.

With regard finally to the fourth element of the invention, the signal processing system may be of the analog or digital type. In either case, its function is to identify irregularities in the heating curve of the solder joint, such irregularities accompanying the solid/liquid transition. Its manner of operation will be more fully explained through later reference to the drawings describing our preferred embodiment of the invention. For the present, we will indicate that the recommended analog method of processing the infrared signals involves the use of the second time-derivative of the thermal signal and the fact that a non-zero second derivative signifies the presence of a departure from a constant heating rate. In the case of digital signal processing, a moment-by-monent computer evaluation of the first derivative, or slope, of the heating curve is carried out. Each new value is compared with the previous one, and a difference exceeding a predetermined threshhold is taken to signify an irregularity in the heating curve.

FIG. 3 is a general diagram of a digital version of the present invention. In FIG. 3, the heating source is the Nd:YAG laser 10 whose output beam is focused by a glass lens 1 into an optical fiber 2 where it emerges from the other end with a given divergence angle. It is then incident upon glass lens 3 where it is rendered somewhat more parallel and proceeds to a dichroic mirror (or "beam splitter") 4 which reflects it downward upon an infrared transmitting lens 5. The function of lens 5 is to focus the laser beam upon the target mounted on the XY table, and also to collect and to direct upward some of the thermal radiation which leaves the target as it becomes warmed. This radiation is at greater wavelengths than the YAG radiation, being typically in the range from about two to five $\mu$m. The dichroic mirror 4 is specially designed as to be largely transparent to the longer wavelength region, so that most of the thermal radiation passes through it and into a second infrared transmitting lens 6 where it is focused upon the infrared detector.

Dichroic beam splitters of the type used here are available from many optical interference filter suppliers who provide filter-design and fabrication services.

Because the YAG laser beam is invisible, the red-light beam from a helium neon (HeNe) laser 12 is added to it to render the focused spot visible. This is helpful during manual programming operations when the various solder-joint locations are being entered into the computer. This is done by use of table-control keys which move the table so that each solder joint in turn is located on the optical axis, whereupon its location is automatically entered into the computer when the operator presses another key.

The infrared detector signal is preamplified and is digitized by an analog-to-digital (A/D) converter 14 whereupon it enters the computer 16.

The computer is responsible for several control and data processing functions:

1. It "memorizes" the target locations in terms of XY-coordinate positions of the table and it sequentially drives the table to each position when ready;
2. At each new target position, the computer operates the YAG-laser shutter 18 for a specified exposure duration, after which it commands the table to move to the next position;
3. It monitors the detector signal and carries out the necessary processing; which includes:
    a. A determination of the moments when a solder surface has begun to reflow and has completed its reflow;
    b. A determination of the time when the molten solder has reached some thermal level at some predetermined value above the reflow level;
    c. A determination of whether accidental laser-beam damage may be occurring. This may occur due to a programming error or a system malfunction which causes the laser beam to impinge on something other than a solder joint, or it may occur due to a glancing reflection of the laser beam from a shiny solder surface and onto the substrate. It can also occur if debris or other easily burned material rests on or near the solder. In any event, the excessive resultant heating is recognized by the computer as an unusually high detector signal. The computer then causes the laser shutter 18 to be closed prematurely and it signals the operator.

The computer communicates with the external world via a keyboard, a video display, a printer and, if appropriate, another computer.

The manner in which the computer digitally determines the times referred to in (a) and (b), above, will be described after some preparatory remarks about the analog determination of reflow phenomena.

Figure 4A:
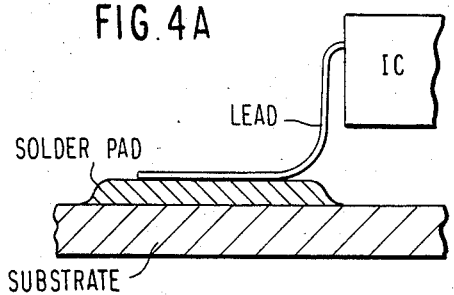
FIGS. 4A and 4B illustrate a lap solder joint before and after reflow, respectively.
Figure 4B:
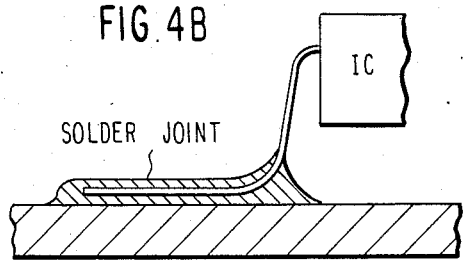
Figure 5A:
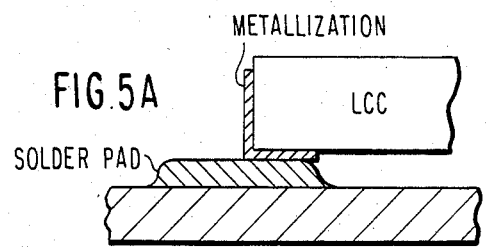
FIGS. 5A and 5B illustrate a solder joint at a leadless chip carrier (LCC) before and after reflow, respectively.
Figure 5B:
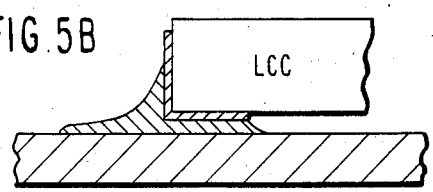

For illustrative purposes, there are shown in FIGS. 4 and 5 two types of solder joints which are amenable to being reflowed by laser beams, comprising a lap joint (shown in FIGS. 4A and 4B before and after reflow, respectively) and a leadless chip carrier (LCC) joint (shown in FIGS. 5A and 5B before and after reflow, respectively). In FIGS. 4A and 4B, the integrated circuit (IC) is initially secured to the substrate, often by use of adhesive beneath the case, such that the contacting surfaces of its electrical leads rest on their respective solder pads, which are rigid. The IC is held tightly against the board such that its electrical leads are under slight compression. During reflow, the contacting portions of the leads sink into the solder, as shown in FIG. 4B, becoming partly or fully immersed and relieving the pressure stresses. The IC is then secure when the resulting joints have cooled.

A similar situation occurs with the LCC of FIGS. 5A and 5B which is also pressed against the solder pads prior to reflow. During reflow, the molten solder wets the metallization and surface tension forces some of it upward to form a fillet on the vertical face.

FIG. 6 illustrates a preferred embodiment of a radiation thermometer incorporating a reflow-sensing capability using an analog method, as opposed to the digital method of FIG. 3. The detector 20 is of lead sulfide and is chopped at 400 Hz. The resulting AC signal is amplified and is converted to a D.C. signal through an "amplifier-converter board" (ACB) 22, after which the signal is "linearized" or processed in circuit 24 so as to correspond to temperature values rather than to detector-output values. Thereupon it is further amplified in amplifier 26 and is directed to the reflow sensing circuit 28.

An emissivity conrol 30 at the ACB 22 is an amplifier gain adjustment which is used in order to take account of the emissivity of the solder.

Figure 7:
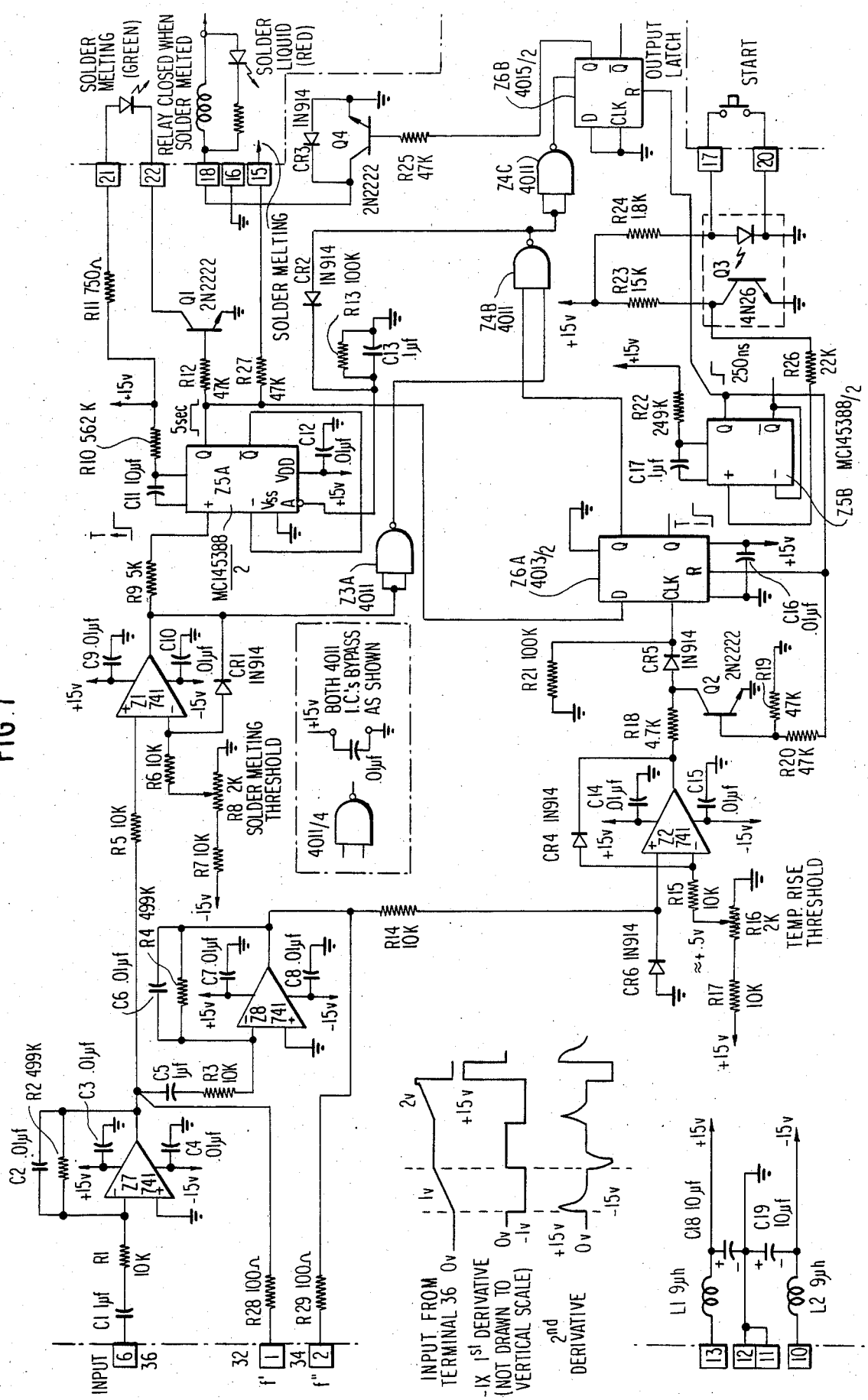
FIG. 7 is a schematic diagram of the reflow sensing circuit 28 of FIG. 6.

A detailed diagram of the reflow sensing circuit is shown in FIG. 7. The two electrical stages at the upper left, denoted by components Z7 and Z8, comprise a pair of electronic differentiators in series. They provide, at terminals 32 and 34, the first and second time derivatives of the signal entering at terminal 36. At left center in FIG. 7 are shown the respective derivatives associated with a particular input waveform. The functions of the remainder of the circuit will be apparent to electrical engineers. The various parts include comparators, "flip-flops" and so forth which are used for timing, thresholding, latching and other functions associated with the routine use of the system. For convenience, the operation of the circuitry of FIG. 7 will be briefly described.

Upon the application of heat to the solder, the input to differentiating amplifier Z7 will rise as shown in the upper waveform in FIG. 7. When the temperature rises to a level in the vicinity of the melting temperature of the solder, amplifier Z7 will provide a low-level output which will be provided to the inverting input of amplifier Z8 and to the non-inverting input of amplifier Z1. The low-level input to the amplifier Z8 will result in a positive spike at the Z8 output, in response to which amplifier Z2 will provide a clock signal to the clock terminal of flip-flop Z6A. Due to the low-level signal present at the D input terminal of the flip-flop Z6A, the Q output of the flip-flop will remain low.

When the solder reaches its melting temperature, the temperature increase will temporarily halt while the solder undergoes a phase transition from solid to liquid. At this time, amplifier Z7 will provide a high-level output which will result in a similar high-level output from amplifier Z1. The high-level Z1 output will be inverted by NAND gate Z3A, thereby providing a second low-level input to NAND gate Z4B which, in turn, provides a high-level signal to disable the reset terminal of circuit Z5A. In response to the high-level output of amplifier Z1, the circuit Z5A provides at its Q output terminal a 5-second pulse which activates transistor $Q_1$ to energize the "solder melting" LED. The 5-second pulse is also provided as the D input to the flip-flop Z6A.

At the end of solder melting, the temperature will begin to increase and the input signal at terminal 36 will correspondingly increase as shown in the upper waveform in FIG. 7. At this time, the output of amplifier Z7 will again fall to a low level to cause the outputs of amplifier Z1 and NAND gate Z3A to become low and high respectively. The downward transition in the output of amplifier Z7 will also result in a positive spike in the output of amplifier Z8, thereby resulting in a further clock pulse provided by amplifier Z2 to the clock terminal of flip-flop Z6A. Assuming that the melting has been completed within the 5-second duration of the pulse from circuit Z5A, i.e., within 5 seconds of the commencement of melting, the D input to the flip-flop Z6A will still be high, so that the clock signal will result in a high-level Q output. With both inputs at a high level, the NAND gate Z4B will provide a low level output, thereby reverse-biasing the diode CR2 and permitting the circuit Z5A to be reset by a low-level reset signal at a timing determined by the delay circuit R13, C13.

The low-level output of NAND gate Z4B will result in a high-level output from gate Z4C to the set terminal of flip-flop Z6B, thereby activating transistor $Q_4$ and energizing the "solder liquid" LED and closing an appropriate relay.

Depressing the "START" button will reset both of flip-flops Z6A and Z6B, thereby preparing the system for subsequent operation.

Figure 8:
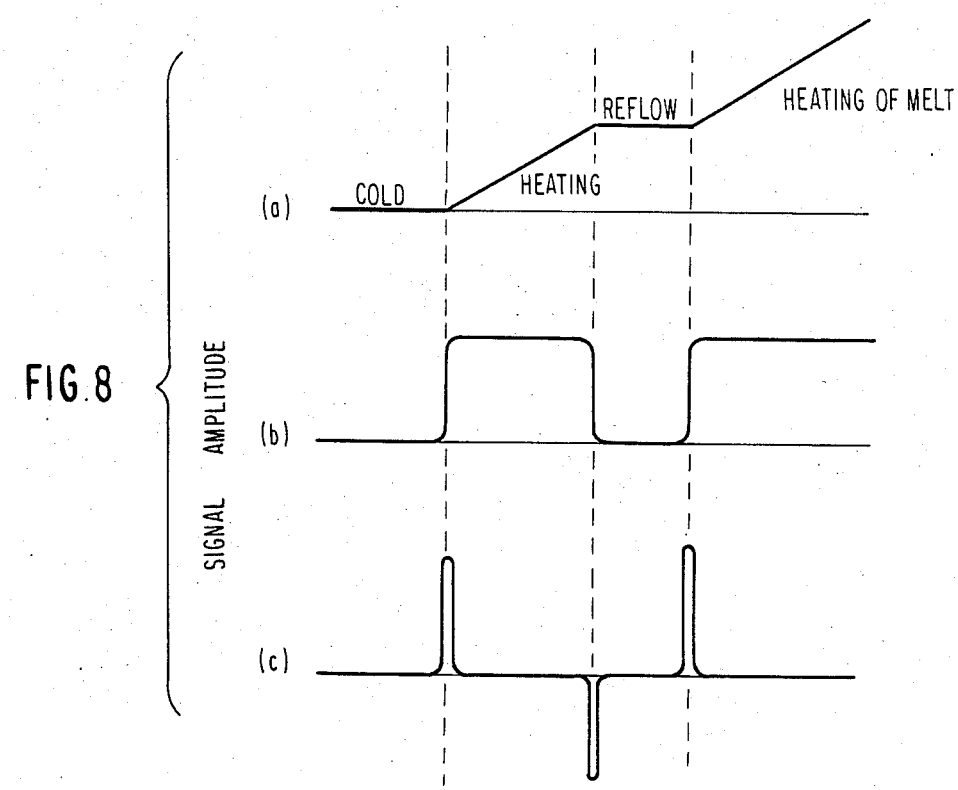
FIG. 8 illustrates three waveform diagrams (a)-(c), with waveform (a) showing an idealized temperature of a solder mass as it undergoes phase change during heating, waveform (b) illustrating the first time derivative of waveform (a), and waveform (c) illustrating the second time derivative of waveform (a)

The waveforms shown at the left in FIG. 7 are presented again in FIG. 8, with slight modifications. The various parts of Curve (a) in FIG. 8 are labeled so that the reader may associate them with the various stages of solder reflow. This curve is idealized here, consisting of straight lines and sharp junctures. Curve (b) in FIG. 8 shows the first derivative with positive polarity, the inverse of that in FIG. 7. Also, the second-derivative spikes of Curve (c) in FIG. 8 are shown idealized, being more pronounced than in the FIG. 7 case.

The reader should note that the first positive-going spike of Curve (c) is of no significance with regard to reflow. It simply indicates the start of warming. This spike is electronically ignored by the circuitry of FIG. 7.

Figure 9:
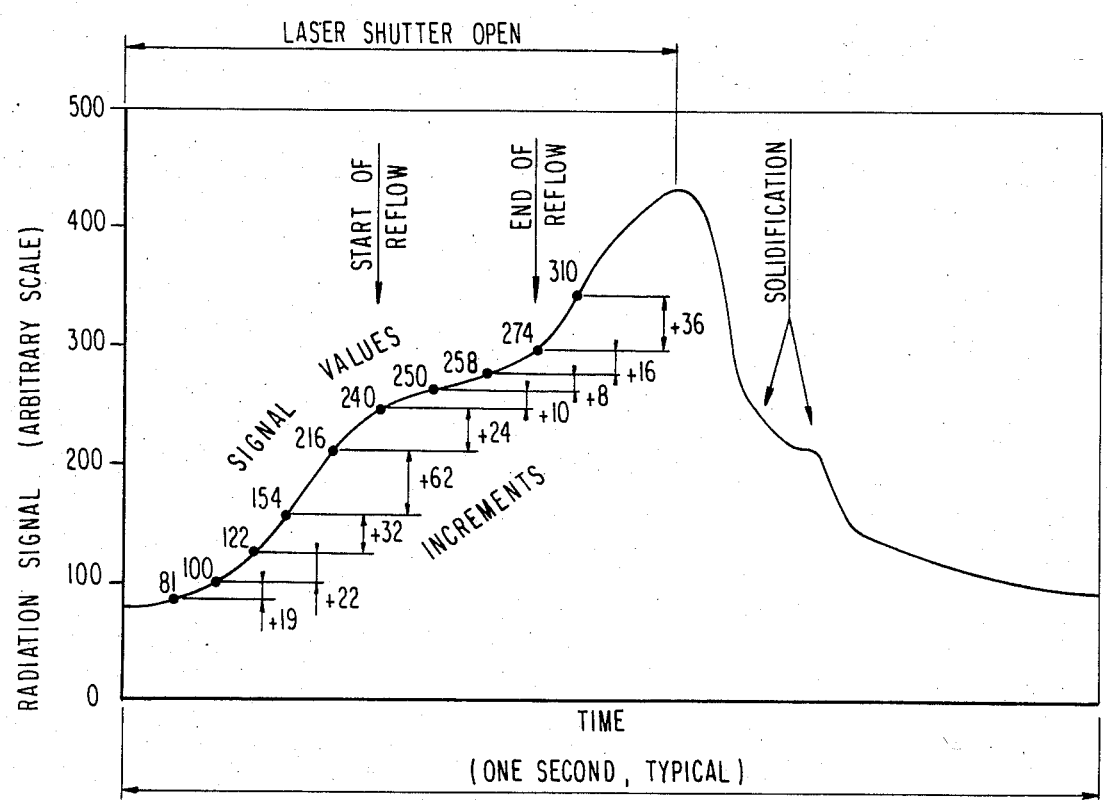
FIG. 9 illustrates a typical radiation signal occurring during a solder reflow process.

Turning now to FIG. 9, which is an approximation of a typical reflow curve for a solder joint, this represents the amplified and filtered detector signal which is to be sampled and digitized by A/D converter and then examined in the computer in the preferred embodiment of the invention. Shown above the first portion of the curve is a sequence of hypothetical signal values which might result from such a sampling. Below the curve are shown the increments in the successive signal values.

The manner in which the computer identifies the moments of the start and end of reflow is a differential one in which it examines the sequence of increments. As the curve starts upward, it is noted that an increasing progression occurs in the values of the increments. In this progression, the computer subtracts each increment value from the succeeding values and recognizes that the difference is a positive number. As reflow begins and the slope of the curve starts to decrease, a sequence of increments will be found where the difference between successive increments is a negative number. At the first occurrence of this, the computer signals the start of reflow. It continues to observe negative differences until reflow is complete and the curve starts upward again. Upon recognizing the first positive change in the incremental values, the computer signals the completion of reflow.

The differential method is an approximate simulation of the analog method of taking derivatives, as described earlier. The extent to which it is approximate is determined by the sampling time which is selected; as the sampling interval is decreased, the simulation becomes more exact.

As was the case in the analog embodiment, the computer is instructed to ignore the first "upturn" in the curve after the laser shutter opens and normal warming begins; otherwise, this could be mistaken for the "end of reflow".

An important feature of the invention is that, once reflow is completed, the method allows one to continue to heat the molten solder to a precise temperature, safely above the reflow point, without one's having to enter into the computer an emissivity value for the solder. Instead, assuming that the composition and therefore the exact melting point of the solder are known, the computer is able to derive its own emissivity value once reflow has been completed. It does this by noting the radiometric signal value at the moment when reflow is complete. Thereupon it can either calculate (by algorithm) or look up (in a "table") the radiometric value which a standard blackbody radiation source would have at precisely the solder melting point. By dividing the observed value by the blackbody value, it arrives at the emissivity value. Thereafter, it can convert radiometric values to actual temperature values while the molten-solder temperature continues to rise, and it can cause the laser shutter to close exactly when some predetermined temperature value above the melting point has been reached.

Alternatively, the user may wish simply to specify that, after reflow has occurred, the heating continue to be applied until the radiometric signal is some pre-established percentage above the melting-point value.

By use of the reverse of the reflow-detection process, the computer can be made to recognize when solidification has occurred, in case it is desired not to disturb the molten solder by accelerating the XY table toward the next target position.

The foregoing comprises a description of a preferred embodiment of the invention. It will be apparent that many modifications of this embodiment are possible without departing from the spirit of the invention. For example, the fixed optical parts and movable table of FIG. 3 can be replaced by a fixed table and movable optical parts. A flexible, infrared transmitting optical fiber, can be added between the infrared detector and the lens/dichroic mirror system so that the latter may be moved while the other system parts remain stationary. Also, the optical system can be inverted so that its axis is directed upward, or in any other direction, in case it is desired to test samples from some direction other than vertically downward. Furthermore, the system can be configured so that the heat-injection axis and the infrared-detection axis are directed toward each other, instead of being coincident. By this means, one could heat a sample at one surface and monitor the heating rate at the opposite surface. Extending this idea, the aforesaid axes may be of arbitrary inclination to each other so that heat-injection and infrared-detection may be from arbitrary directions.

A second means of reflow detection will now be described, which is to be included within the scope of the invention. This means makes use of a reflectance method by which a change in the physical properties of a solder surface is detected at the moment of solid-to-liquid transition. This visible change is a matter of common experience to laser-beam solder-reflow technologists. Most often it occurs in the form of a change from a slightly granular solid surface to a perfectly glossy molten one. It also sometimes happens during melting that the surface contour will change. In either case, use can be made of a narrow beam of light directed at the surface and of a photodetector so positioned as to receive some portion of the light reflected from the surface. Prior to melting, the surface reflections will remain unchanged and the detector signal will be constant. At the moment that the solid-to-liquid transition occurs at the surface, a discontinuity will be noted in the detector signal. Most often, this will be a signal increase due to the enhanced reflectance of the molten surface. Conversely, it can be a decrease due to a change in surface contour, and this will depend upon the optical geometry of the system.

It is anticipated that there will be occasions in which, by chance, the aforesaid increase and decrease will exactly cancel each other, leaving no net signal change for reflow detection. This occurrence will be forestalled by the use of two or more detectors disposed at slightly different locations, and monitored by separate electronic means, so that at least one of them will register the desired glossy reflection. In any event, by use of a multiplicity of detectors, at least one of them is certain to detect either an increase or decrease in the reflected light intensity, be it due to a glossy reflection or to a change in surface contour. The detection of a signal change in any one of a group of separate detectors can be carried out by standard electrical practices.

Figure 10A:
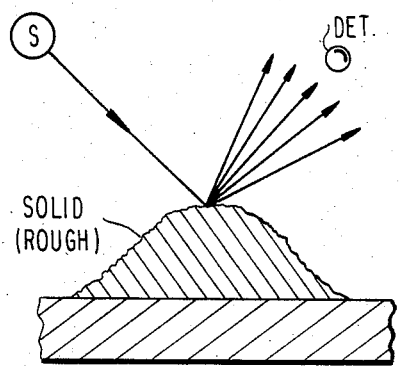
FIGS. 10A and 10B illustrate a light-reflectance liquefaction detection technique according to the present invention, with FIG. 10A illustrating the solder before reflow and FIG. 10B illustrating the solder after reflow.
Figure 10B:
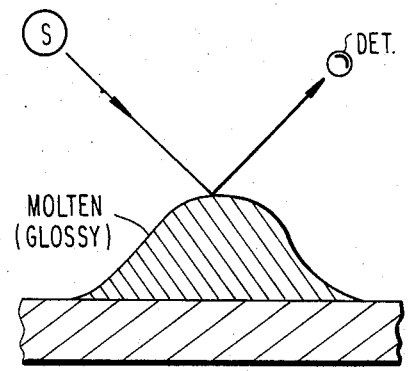

FIGS. 10A and 10B illustrate a hypothetical solder joint before and after reflow, respectively. The jagged-line contour in FIG. 10A represents the crystalline surface of solid solder and shows that the reflected rays spread throughout a small angle, with some of them bypassing the detector. In the molten case, the reflection is more mirror-like so that the detector receives more reflected power.

Figure 11:
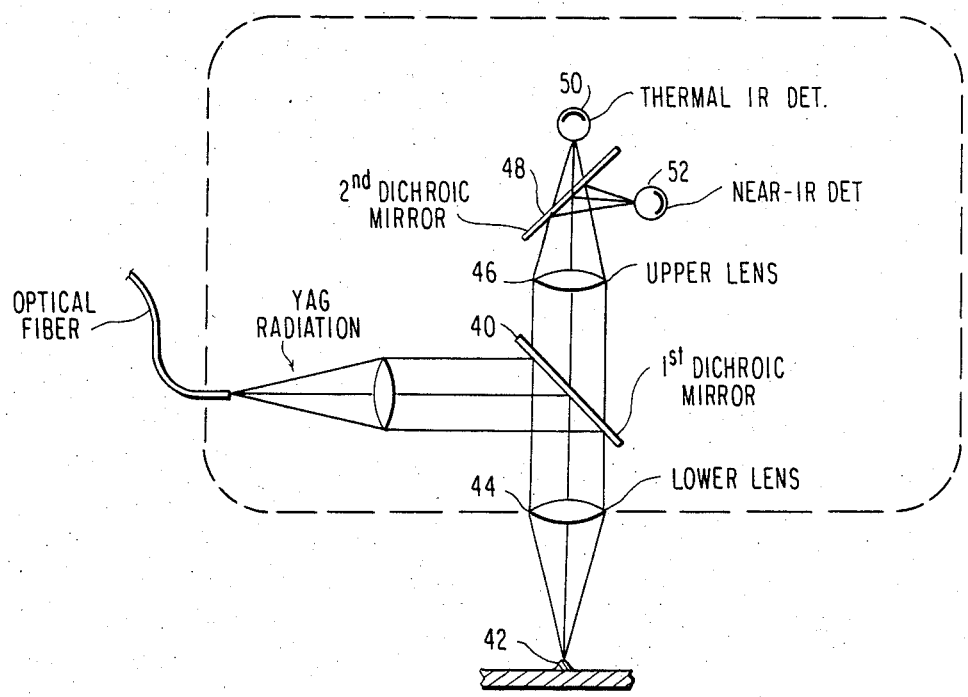
FIG. 11 is a brief illustration of the essential components of a light-reflectance monitoring technique according to the present invention.

FIG. 11 illustrates an embodiment of the reflectance method, using a single detector and being incorporated into the existing concept which was shown in FIG. 3. The rightward-proceeding YAG laser radiation impinges upon the first dichroic mirror 40 and is largely deflected downward to the target 42 where the absorbed portion causes heating and where the remainder is reflected in various directions. A portion of it proceeds upward through the lower lens and most of it is reflected leftward by the first dichroic mirror 40, where it serves no purpose. However, the mirror 40 is slightly transparent to the 1.06-micrometer laser radiation and so a portion of this radiation proceeds upward through the upper lens 46 to the second dichroic mirror 48. This mirror serves the purpose of separating the 1-μm radiation from the longer-wave thermal radiation which is emitted by the heated target. The thermal radiation proceeds to the infrared detector 50, as in FIG. 3, whereas the 1-μm radiation is diverted to a near-infrared detector 52, preferably of silicon, which serves as the reflectance sensor for reflow.

Finally, in an application addressed to the reflow soldering of lap joints such as on flat pack integrated circuits (IC's), leadless chip carriers (LCC's) and similar devices, we include as a part of our invention a concept which we shall call the integral, self-dividing preform. This is an appropriately shaped strip of solder which is placed between a row or a group of device leads and their respective pads, preparatory to reflowing. The device is secured to the substrate, as is discussed in connection with FIG. 5, and reflow is carried out by laser-beam means. As the preform becomes molten, it will separate itself into individual solder masses, one at each joint, through a combination of surface tensile forces and of repulsion by the substrate surface. This arises because molten solder is attracted to metallic surfaces, particularly if they are treated with solder flux, and it is repelled by unfluxed non-metallic surfaces, especially if a "solder mask" has been applied (this is an adhering sheet of solder-repellent material with cutouts for the desired solder positions).

In the case of a flat pack IC, which has rows of electrical leads issuing from two opposite sides, one suitably shaped preform would be placed beneath the contacting parts of each row of leads. For the LCC, which is square and which has rows of contacts on four sides, a square, hollow preform of the proper size would be placed under its perimeter, protruding slightly so as to be accessible to the reflow laser beam.

In order to carry out reflow by laser beam, one might hope to irradiate one electrical contact at a time, proceeding to the next one only after the first one has reflowed. A glance at FIG. 5, however, will remind the reader that, during conventional reflowing when all joints are molten together, the contacts settle into the solder, which is a desirable condition. In laser-beam reflow, the same result must be achieved, and this can occur only if all joints are molten at the same time.

My invention teaches two methods whereby simultaneous reflow can be brought about, one using time-sharing of the laser beam and the other using spatial division of the beam.

In time-sharing the laser beam is brought to the target locations successively and repeatedly by use of scanning mirrors or other known beam deviators. While the beam is in transit, the laser shutter is closed. It opens only when the target is reached and for a specified time period in which the beam spot "dwells" on the target. Each exposure therefore stores a finite amount of energy in the joint-to-be, with the amount dependent upon the product of the laser-beam power and the exposure duration. The beam then impinges upon the remaining targets in succession, during which interval the previous targets are drained of some of their thermal energy. However, with a laser beam of sufficient power, the application of repeated energy pulses will result in a net temperature increase at each target and, after a sufficient interval, reflow of all targets will be achieved.

Should it happen, as is often the case, that the connections external to the solder joints differ in their thermal capacities, then the jonts which experience less heat-sinking risk being overheated while those with greater heat-sinking are still approaching reflow. In this event, the power pulses into each joint can be metered, under computer control, based upon the heating needs of each joint as determined by the thermal detection system which concurrently scans the joints with the laser beam. Metering may be carried out by control of either the pulse duration or the laser-beam power by means of various modulators which are in common use.

In the event that all joints share a common heat-sinking value, then they may be heated simultaneously and steadily by beam division or beam shaping, as it may be called. Various prism and/or mirror devices, branched optical fiber bundles, beam splitters and so forth are known in the art by which a beam of optical radiation may be divided into a number of less powerful beams having cross-sections of arbitrary shape. As a simple example, an ordinary laser beam which has a round cross section can be converted into a fan-shaped beam, having a rectangular cross section, by causing it to impinge upon a cylindrical lens whose axis is at right angles to the beam. A simple example of a cylindrical lens would be a rod of solid glass. The lens diameter would be comparable to the beam diameter or greater. By use of such a lens, what would normally be a spot in a target plane can be converted to a line. The orientation of the line will be perpendicular to the direction of the lens axis and is thus readily controlled. Thus, by use of beam splitters, a laser beam might be divided into four beams of equal intensity and these could be directed to four cylindrical lenses or other "spot-to-line"

converters, and four "lines" of radiation could be made to impinge upon the four rows of contacts at an LCC, for example. The continuous lines of radiation could either be masked into spots, one for each contact, so that undesired heating of the substrate between contacts would be avoided, or the lines could be broken into spots by the focusing action of a row of small, conventional lenses used in conjunction with each cylindrical lens.

What is claimed is:

1. In a method of reflow soldering comprising the steps of disposing first and second components to be soldered in contact with a quantity of solder in solid phase, heating said solder to a temperature above its melting temperature to change the phase of said solder from solid to liquid, and thereafter allowing said solder to cool and solidify, said method further comprising non-contact monitoring said solder during said heating step to determine when said solder has melted, said monitoring step comprising optically detecting the change of phase of said solder by monitoring a property of said solder, other than the temperature of said solder, which property changes above said melting temperature, and interrupting said heating step in accordance with the value of said monitored property.

2. A method as defined in claim 1, wherein said property is the rate of change of temperature of said solder.

3. A method as defined in claim 1, wherein said monitoring step comprises: detecting a level of emission of a predetermined wave length of light from said solder, said level of emission being dependent upon the temperature of said solder; detecting a decrease in the rate at which said emission level increases to thereby determine the commencement of solder melting; and detecting a subsequent increase in the rate at which said emission level increases to thereby detect that said solder is substantially fully melted.

4. A method as defined in claim 3, further comprising non-contact monitoring the temperature of said solder after said subsequent increase, said heating step being continued until said solder reaches a temperature above said melting temperature.

5. A method as defined in claim 1, wherein said property comprises a surface reflectance property of said solder.

6. A method as defined in claim 5, wherein said non-contact monitoring step comprises: directing an optical beam at said solder for reflection by said solder; detecting the amount of light reflected from said solder to a predetermined detection point; and monitoring a change in said detected amount of reflected light which occurs as a result of a change in the surface smoothness of said solder above said melting temperature.

7. A method as defined in claim 5, wherein said non-contact monitoring step comprises: directing an optical beam at said solder for reflection by said solder; detecting the amount of light reflected from said solder to a predetermined detection point; and monitoring a change in said detected amount of reflected light which occurs as a result of a change in the surface contour of said solder.

8. A method as defined in claim 6, wherein said step of detecting the amount of said reflected light comprises detecting reflected light at at least two different locations simultaneously.

9. A method as defined in claim 7, wherein said step of detecting the amount of said reflected light comprises detecting reflected light at at least two different locations simultaneously.

10. A method as defined in claim 1, wherein said disposing step comprises: disposing a plurality of first components and a plurality of respective second components in contact with respective quantities of solder in solid phase at a plurality of solder locations, each solder location including one of said first components, one of said components and a respective one of said quantities of solder; and said heating step comprises successively heating said plurality of solder locations while separately monitoring said property at each location, and interrupting the application of heat at each location where the solder has been heated to a temperature above its melting temperature while continuing the application of heat to the remaining solder locations.

11. A method as defined in claim 1, wherein said disposing step comprises: disposing a plurality of first components and a respective plurality of second components in contact with respective quantities of solder in solid phase at a respective plurality of solder locations, said respective quantities of solder comprising at least one integral solder preformed in contact with at least two of said solder locations; and said heating step comprises: heating said at least two solder locations until said solder melts and separates into individual solder quantities.

12. An apparatus for performing reflow soldering wherein first and second components are disposed in contact with a quantity of solder in solid phase, said solder is heated to a temperature in excess of its melting temperature to change the phase of said solder from solid to liquid and is thereafter allowed to cool, said apparatus comprising:
heating means for applying heat to said solder;
monitoring means for detecting the change of phase of said solder by non-contact monitoring a property of said solder, other than the temperature of said solder, which property changes above said melting temperature; and
interrupting means for interrupting the application of heat to said solder in accordance with the output of said monitoring means after said property has changed to indicate said phase change.

13. An apparatus as defined in claim 12, wherein said monitoring means monitors the rate of change of the temperature of said solder during application of heat to said solder.

14. An apparatus as defined in claim 12, wherein said monitoring means comprises:
first generating means for detecting the level of emission of a predetermined wavelength of light from said solder and for generating a first signal indicating said detected level of emission;
second generating means for generating a second signal corresponding to the rate of change of said first signal; and
third generating means for generating a third signal corresponding to the rate of change of said second signal.

15. An apparatus as defined in claim 14, wherein said third signal has a first state (e.g., negative) when said rate of change of said first signal is decreasing and a second state (e.g., positive) when said rate of change of said first signal is increasing, said interrupting means interrupting said application of heat upon the occurrence of a first state of said third signal followed by the occurrence of a second state of said third signal.

16. An apparatus as defined in claim 12, wherein said monitoring means comprises:
   first generating means for generating an analog first signal indicating the level of emission of a predetermined wave length of light from said solder;
   means for sampling said first signal to obtain a sequence of samples and for converting said samples and for converting said samples to respective digital signals;
   means for comparing values of successive ones of said digital signals to obtain a sequence of difference values; and
   means for comparing successive ones of said difference values to determine whether the rate of change of said solder temperature is increasing or decreasing.

17. An apparatus as defined in claim 16, wherein said predetermined wavelength of light is an infrared wave length.

18. An apparatus as defined in claim 17, wherein said heating means comprises means for directing at said solder optical energy having a wavelength other than said predetermined wavelength.

19. An apparatus as defined in claim 12, wherein said monitoring means monitors a surface reflectance property of said solder.

20. An apparatus as defined in claim 19, wherein said monitoring means comprises: means for directing an optical beam at said solder for reflection by said solder; detecting means for detecting the amount of said light reflected to a predetermined point; and means for monitoring a change in said detected amount of reflectivity which occurs as a result of a change in the surface smoothness of said solder above said melting temperature.

21. An apparatus as defined in claim 12, wherein said monitoring means comprises means for directing an optical beam at said solder for reflection by said solder, detecting means for detecting the amount of said light reflected to a predetermined point, and means for monitoring a change in said detected amount of reflectivity which occurs as a result of a change in the surface contour of said solder above said melting temperature.

22. An apparatus as defined in claim 20, wherein said detecting means comprises means for detecting said amount of light reflected to said predetermined point and to at least one additional point.

23. An apparatus as defined in claim 21, wherein said detecting means comprises means for detecting said amount of light reflected to said predetermined point and to at least one additional point.

24. A method as defined in claim 1, wherein a change in said monitored property indicates the solid-to-liquid phase transition of said solder independently of any temperature measurement.

* * * * *